United States Patent [19]
Barrault et al.

[11] Patent Number: 5,256,872
[45] Date of Patent: Oct. 26, 1993

[54] DEVICE FOR MEASURING CURRENT BY OPTIC FIBER AND DUAL POLARIZATION ANALYSIS

[75] Inventors: Michel Barrault, St. Ismier; Pascal Royer; Antoine Kevorkian, both of Grenoble, all of France

[73] Assignee: Merlin Gerin, France

[21] Appl. No.: 883,204

[22] Filed: May 14, 1992

[30] Foreign Application Priority Data

May 27, 1991 [FR] France ............... 91 06485

[51] Int. Cl.$^5$ ............................................. H01J 5/16
[52] U.S. Cl. ............................. 250/227.17; 324/96
[58] Field of Search ........... 250/225, 227.17, 231.10; 324/96

[56] References Cited

U.S. PATENT DOCUMENTS

| | | | |
|---|---|---|---|
| 4,255,018 | 3/1981 | Ulrich et al. | 250/227.17 |
| 4,740,078 | 4/1988 | Daendliker et al. | 250/227.17 |
| 5,136,235 | 8/1992 | Brandle et al. | 324/96 |

FOREIGN PATENT DOCUMENTS

| | | |
|---|---|---|
| 0430060 | 6/1991 | European Pat. Off. |
| 2097299 | 3/1972 | France. |
| 2622969 | 5/1989 | France. |

OTHER PUBLICATIONS

8132 RGE Revue Generale de l'Electricite, (1990) Apr., No. 4, Paris France, pp. 62–67.
8030 Electronics Letters, vol. 19 (1983) Jul., No. 15, London, Great Britain, pp. 578–579.

*Primary Examiner*—David C. Nelms
*Attorney, Agent, or Firm*—Parkhurst, Wendel & Rossi

[57] ABSTRACT

The device measures the current intensity in a conductor by FARADAY effect in a monomode optic fiber. It comprises a separator-polarizer formed for example by two coplanar half-disks of polarizing foil, whose polarization directions form a required angle, 90° or 45°. Photodiodes formed by a two-quadrant photodetector in the shape of a disk of the same diameter as that formed by the separator-polarizer, are located behind from the separator-polarizer. The photodiodes are connected to an electronic unit.

9 Claims, 5 Drawing Sheets

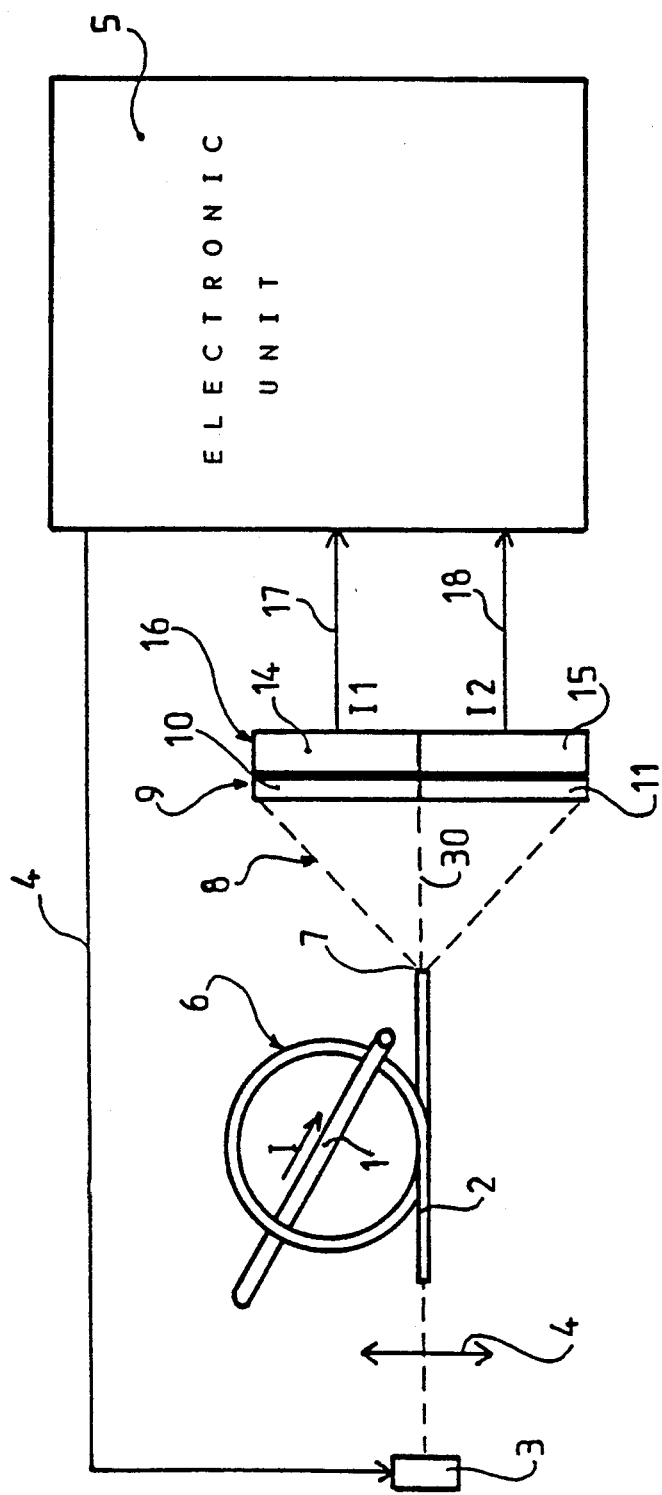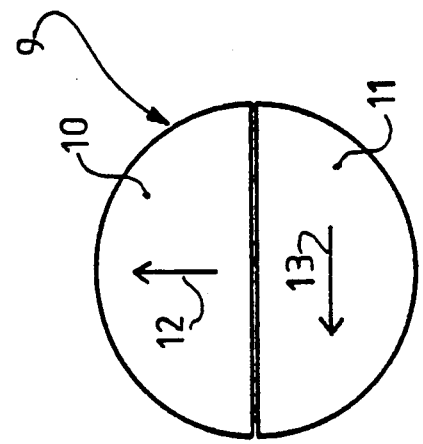

DEVICE FOR MEASURING CURRENT BY OPTIC FIBER AND DUAL POLARIZATION ANALYSIS

BACKGROUND OF THE INVENTION

The present invention relates to a device for measuring current by using an optic fiber. The measuring principle is based on the FARADAY effect in a monomode optic fiber.

A device has been proposed device for measuring current in a conductor by using the FARADAY effect in a slightly birefringent monomode optic fiber. The fiber is wound, in a certain number N of turns, around the conductor.

The light, polarized linearly and preferably monochromatic, is subjected, due to the effect of the magnetic field parallel to its propagation direction, to a polarization rotation called "FARADAY rotation" of angle F, which is given by the following relation:

$$F = VNI$$

where V is the VERDET's constant of the optic medium, which, in the case of a silica optic fiber equal, is to 3 microradians/A for a wavelength of 780 nm.

Measurement, or detection, of this polarization rotation angle F consequently enables the value of the current intensity I in the conductor to be deduced.

The article by Messrs. ROYER, KEVORKIAN, RIVAL, TURC and CARDOT entitled "Optic fiber current sensor", published in the "Revue Générale de l'Dlectricité", 1990, n°4, pages 62 to 67, describes two possible embodiments of a current sensor operating according to this principle, and differentiated by their principle for detecting, (i.e., for measuring) the polarization rotation angle F.

In both cases, light emission in the monomode optic fiber is achieved by using a laser diode which constitutes the required monochromatic light source.

The first configuration, described in this article, uses a detection called "90°". Measurement of the angle F is then achieved by separating the light wave output from the optic fiber into two light waves linearly polarized 90° from one another. To achieve this, a 90° separator-polarizer cube is used, which is an off-the-shelf item. Each of these two light waves is received on a respective photodiode, whose current consequently supplied is measured, respectively I1 and I2. The value of the angle F can then be deduced, by means of suitable electronic means, by applying the formula:

$$(I1 - I2)/(I1 + I2) = \sin 2F$$

A separator/polarizer cube however has the drawback of having a polarization ratio of 1 to 2% in intensity on each channel, which introduces a fairly penalizing signal distortion. Moreover, a separator cube of this kind is rather expensive, which increases the cost price of the sensor.

The second configuration set out in this article uses detection called "45°" which has the advantage of enabling a single optic fiber winding to be used to cover a wide range of current intensities to be measured. According to this second process, the light beam coming from the optic fiber after rotation F is separated into two components linearly polarized in two directions making an angle of 45° between them, rather than 90° as in the previous case. As a 45° separator-polarizer cube cannot be found off-the-shelf, practical application of this process involves using a semi-reflecting blade and two WOLLASTON prisms each connected to a photodiode, which is even heavier and more costly than the previous method.

It is moreover shown that the intensities I1 and I2 collected in these two photodiodes are expressed by relations of the form:

$$I1 = Io(1 + \cos 2F)/4$$

$$I2 = Io(1 + \sin 2F)/4$$

where Io is the intensity corresponding to the light source emitted by the above-mentioned laser diode.

Determining sin 2F and cos 2F requires the intensity Io corresponding to the source to be determined beforehand. In state-of-the-art assemblies, this value Io is determined by using a semi-reflecting blade, located upline from the optic fiber and a photodiode, which makes this type of installation even heavier.

SUMMARY OF THE INVENTION

The object of the invention is to overcome these drawbacks. It relates for this purpose to a device for measuring the current intensity flowing in a conductor, comprising a monomode optic fiber making a predetermined number of turns around the conductor a laser diode for flowing a linearly polarized light wave through the conductor, and a measuring device located at the output of the fiber to measure the angle rotation of the linear polarization direction of the light wave due to the effect of the magnetic field created by the current. The angle rotation is representative of the current intensity. The measuring device comprises, at the output of the optic fiber, a separator-polarizer formed by at least two pieces of polarizing film, through which the light beam coming from the fiber passes, the relative polarizations of the pieces of polarizing film forming a predetermined angle therebetween, a respective photodiode associated with each of the pieces of film for detecting the respective currents corresponding to their lighting, each of these photodiodes being connected to an electronic unit able to consequently perform computation of the angle rotation and to deduce therefrom the value of the intensity to be measured.

Preferably, the separator-polarizer comprises two distinct coplanar pieces, appreciably orthogonal to the axis of the light beam, the pieces of film being two half-disks of the same diameter, placed appreciably edge to edge, in such a way as to reconstitute a complete disk which is coaxial to the light beam output from the fiber. The angle formed between the polarizations of the two pieces is 90° or 45°. The two above-mentioned photo-diodes are advantageously formed by a two-quodront photodetector, advantageously in the shape of a disk appreciably of the same diameter as that reconstituted by the two pieces of polarizing film, the two-quadrant photodetector being located downline coaxially and a small distance from the two adjoined half-disk pieces of polarizing film.

In the case of detection called "45°", the intensity Io of the light source can be calculated from the measured currents. It can also be determined at the output from the optic fiber, for example by means of a photodiode directly receiving the light coming from this fiber and placed behind a preferably central orifice provided in the separator polarizer formed by the two pieces of polarizing film. According to another alternative embodiment, the intensity Io is determined by means of a photodiode receiving the light coming from the optic fiber then reflected either by a mirror preferably placed on the same support as that supporting the two pieces of film, or by the two pieces of film themselves.

BRIEF DESCRIPTION OF THE DRAWINGS

The invention will be better understood, and its advantages and other features will become more clearly apparent from the following description of two illustrative embodiments of the current measuring device, given as non-restrictive examples only and represented in the accompanying drawings, in which:

FIG. 1 is an overall block diagram of the current measuring device in a first embodiment, using detection called "90°";

FIG. 2 shows a preferred embodiment of the separator-polarizer used in the device in FIG. 1 and seen in plan view;

DESCRIPTION OF THE PREFERRED EMBODIMENT

Figure 3:
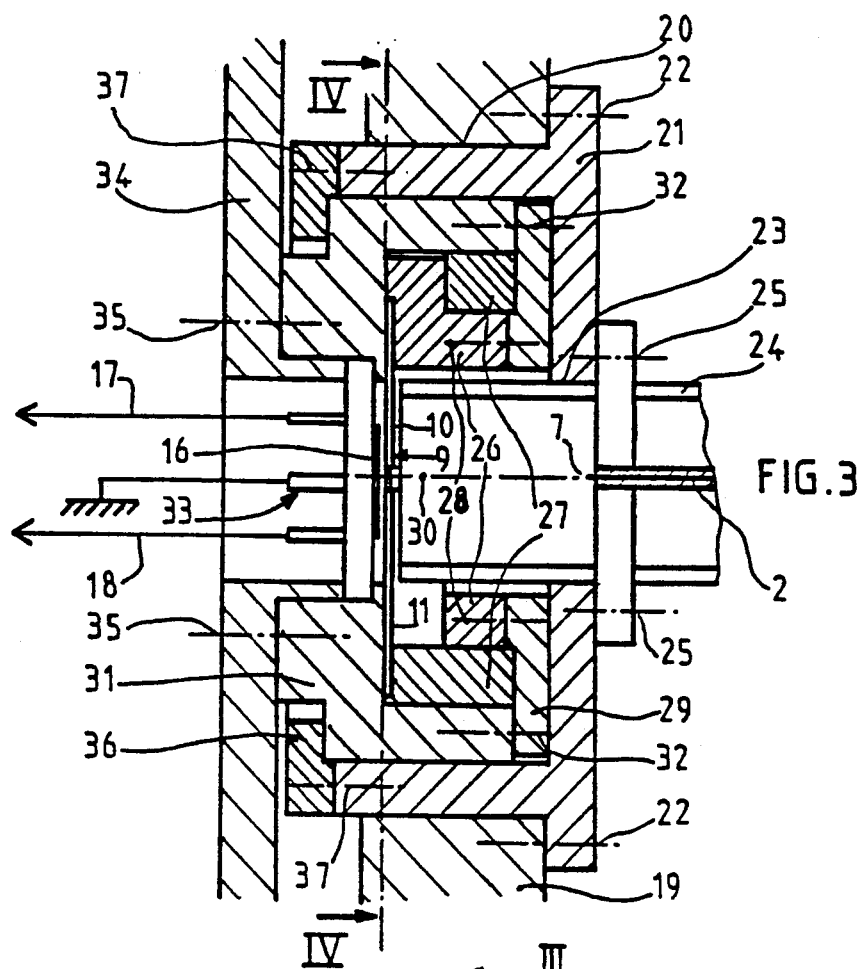
FIG. 3 is a detailed view of the detection module, designed to determine the FARADAY rotation, which is used in this device, the module being seen in longitudinal section according to III-III of FIG. 4.

FIGS. 1 and 2 represent a device for measuring via an optic channel the intensity I of the current flowing in a conductor 1, (e.g., 20,000 amps)

The device uses the FARADAY effect, or "FARADAY rotation" of angle F, which is created in a monomode, slightly birefringent optic fiber 2. A monochromatic and linearly polarized light wave flows through optic fiber 2 by an emitting laser diode 3, preferably with interposition of a lens 4 focusing the light emitted by the diode 3.

The emitting laser diode 3 is itself supplied with electrical power by a connection 4 connected to an electronic unit 5, which is the power supply and analysis unit of the device.

In the example represented, the monomode optic fiber 2 is wound in a spiral 6 around the conductor 1, and the polarization plane of the light wave undergoes a FARADAY rotation of angle F given by the relation:

$$F = V.I$$

wherein V (Verdet's constant) of silica equals 3 microradians/A.

In the embodiment according to FIG. 1, measurement of the angle F is performed by a detection called "90°", for which the light beam 8 at the output 7 of the fiber 2 has to be separated into two beams whose polarization axes are perpendicular to one another.

This is achieved, according to an embodiment of the invention, by applying the outgoing beam 8, possibly via a lens, to a separator-polarizer disk 9 made up of two half discs 10,11 of polarizing film having, respectively two polarization directions, respectively 12 and 13 (FIG. 2), respectively, which are orthogonal to each other.

The two half discs 10 and 11 are both, in the shape and same diameter, and are arranged to form a complete disk (see in FIG. 2) which is preferably orthogonal to the axis 30 of the outgoing light beam 8, and coaxial to axis 30.

The light intensities collected by each of these coplanar polarizing half-disks 10,11 are detected by two respective photodiodes 14,15 which are adjoined to the separator-polarizer, behind the latter. Very simply, they are formed by the two respective halves 14,15 of a standard circular two-quadrant photodetector 16, which is chosen with a diameter equal to that of the separator-polarizer 9.

The intensities I1 and I2 of the currents detected at the output of the photodiodes 14 and 15 are measured and processed by the above-mentioned electronic unit 5, to which the photodiodes are connected by connections 17 and 18. The unit 5 deduces therefrom the value of the FARADAY rotation angle F by applying the formula:

$$(I1 - I2)/(I1 + I2) = \sin 2F$$

As described in the above-mentioned article, cancelling out the optic activity due to temperature variations is advantageously achieved by making a double reverse torsion of the optic fiber 2. Each half-length of fiber is twisted at equal torsion rates, but of opposite directions. A heat compensation is in addition advantageously achieved also by the processing performed by the electronic unit 5.

To perform adjustment, according to a known principle, at zero current of the polarization direction of the light at the output 7 of the fiber 2, 45° from the axes 12 and 13 of the half-discs 10 and 11, the detection module 9,16 is rendered free in rotation, which avoids having to rotate the fiber 2 to perform adjustment at zero current. Moreover, it is advantageous to provide for the possibility of accurately adjusting the orthogonality of the polarization directions 12 and 13 by allowing a certain rotation of the half-disks 10 and 11 with respect to one another.

Figure 4:
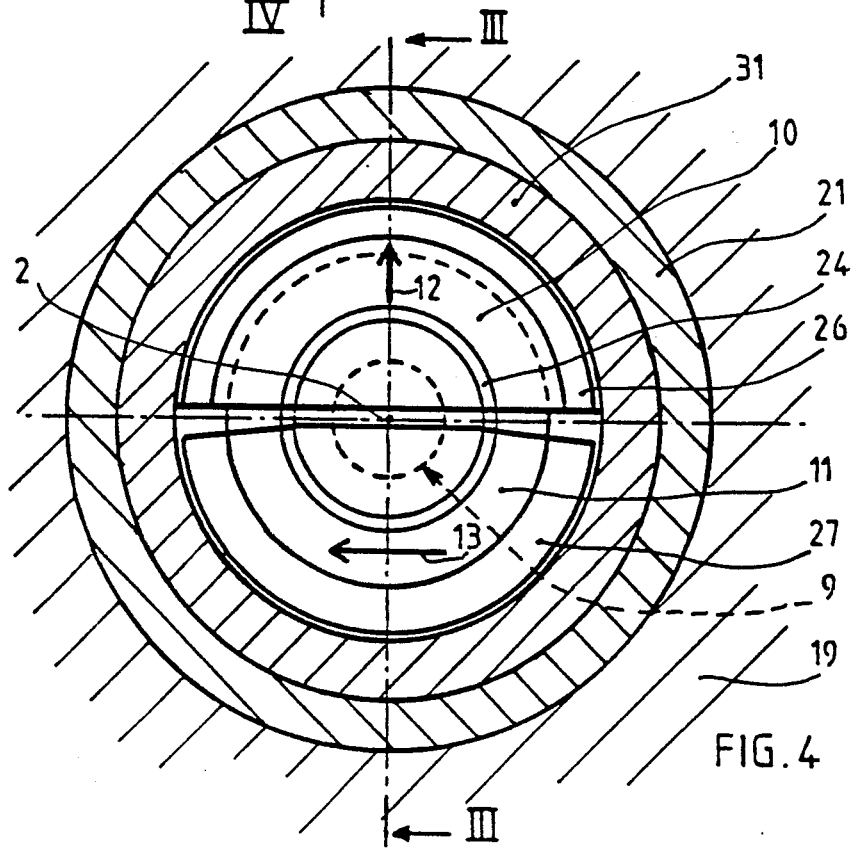
FIG. 4 is a view of the same module, seen in transverse section according to IV—IV of FIG. 3.

The two adjustment possibilities are clearly apparent in FIGS. 3 and 4, which represent in detail the detection module.

Referring to FIGS. 3 and 4, the detection module comprises frame, 19 in the form of a vertical wall drilled with a circular orifice 20 which receives a circular guide 21 held in position by screws 22 (only the axes of the screws are) represented in FIG. 3.

In a central orifice 23 of this guide 21, there is embedded a base 24 bearing the optic fiber 2 and held in position by screws 25. The base 24, and therefore the fiber 2, are consequently fixedly mounted in the frame 19.

The periphery of upper polarizer half-disk 10 is fixed to a brass part 26. Likewise, the periphery of lower polarizer half-disk 11 is fixed to another brass part 27. The parts 26,27 are not only arranged and positioned so that the half-disks 10 and 11 together form a complete disk 9 coaxial to the fiber 2 and orthogonal to its output axis 30, but are in addition overlapping to allow them a relative rotation to allow fine adjustment on the optic bench of the orthogonality of the favored polarization axes 12 and 13. Securing in the required position is then performed by screws 28 which secure and clamp the supports 26,27 against a first cover 29.

The two support and adjustment parts 26 and 27 are in addition held in a second cover 31 which is itself securely fixed to the first cover 29 by screws 32.

The two-quadrant photodiode 16 and its connector 33 are moreover fixed to an external support 34 which is securely fixed to the cover 31 by screws 35. The cover 31 is itself held by a lock washer 36 which is securely fixed to the part 21 by screws 37.

Thus the parts 26,27,28,29,31,34 form a rigid assembly which, after the securing screws 37 have been loosened, can rotate in the guide 21 securely fixed to the assembly support 19. The above-mentioned adjustment at zero current is therefore carried out, without touching the fiber 2, by rotation of the rigid assembly, which is then locked in position by retightening the screws 37.

Figure 5:
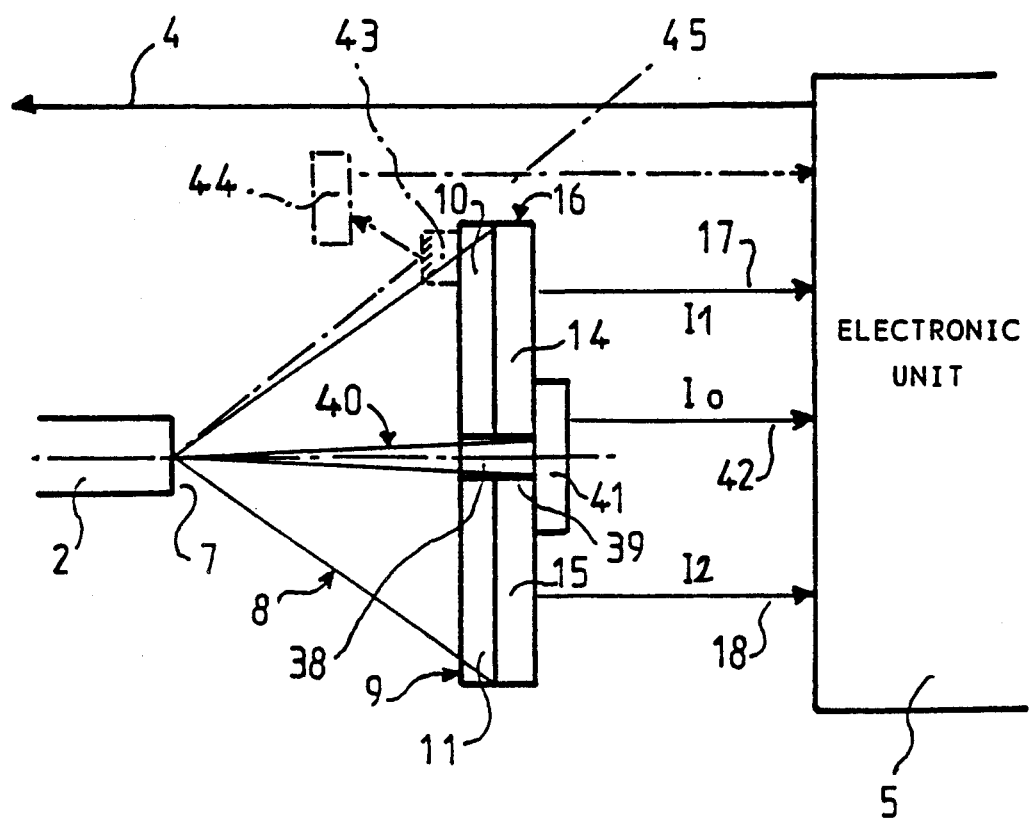
FIG. 5 shows the detection part used in a second embodiment of the current sensor, using detection called "45°"
Figure 6:
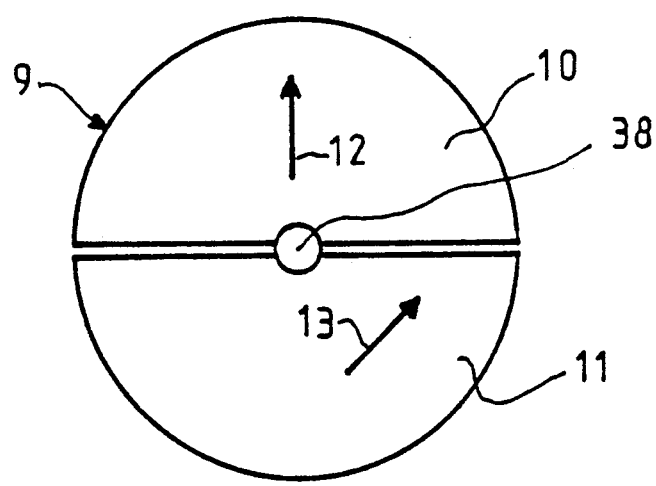
FIG. 6 shows, in the same manner as FIG. 2, the separator-polarizer which is used for the second embodiment.

The invention is also particularly advantageously applicable to detection called "45°", and a preferred embodiment of the corresponding detection module is represented schematically in FIGS. 5 and 6.

This embodiment differs from the previous one by the fact that the polarization axes 12 and 13 of the two polarizer half-disks 10 and 11 are oriented 45° with respect to each other rather than 90°. Under these conditions, this involves a detection called "sine-cosine" and the rotation angle F can be extracted from the relations:

$$I1 = Io\,(1+\cos 2F)/4$$

$$I2 = Io\,(1+\sin 2F)/4$$

This requires Io to be known, which is the intensity corresponding to the light emitted by the source 3. Io can be calculated by the electronic unit 5 from the values of I1 and I2. Io can in fact be obtained from the formula:

$$Io = 4[(I1 + I2) - \sqrt{2 I1 I2}\,]$$

In the preferred embodiment represented in FIGS. 5 and 6, determining Io is achieved simply by providing small axial orifices 38 and 39 in separator-polarizer disk 9 and the two-quadrant photodetector 16, respectively. The two coaxial orifices are appreciably of the same diameter.

Consequently, the center part 40 of the light beam 8 at the output 7 of the fiber 2 passes through the two orifices 38,39, this beam being representative of the intensity Io of the source.

An auxiliary photodiode 41 is adjoined to the photodetector 16, behind the latter, and the intensity Io which it thus detects is entered, via a conductor 42, for use in the electronic unit 5.

Alternatively, rather than forming orifices 38 and 39 in the disks 9 and 16, small reflecting mirror 43 may be fixed to along the disk 9, for example the top part as indicated by the mixed lines, and on the face situated opposite the fiber output 7. Mirror 43 is cooperable with a measuring photodiode 44 receiving the beam reflected by the mirror and connected to the unit 5 by a connection 45. It can also be envisaged to measure Io from the light directly reflected by the polarizer.

The two foregoing embodiments are compact embodiments, and preferably the photodetectors are adjoined to the polarizer-separators. This does not of course constitute the only possibility and, if on the other hand the measuring photodetectors are required to be located away from the fiber 2, and consequently from the conductor 1, it is possible, as shown schematically in FIG. 7, to locate the photodetectors at a distance.

Figure 7:
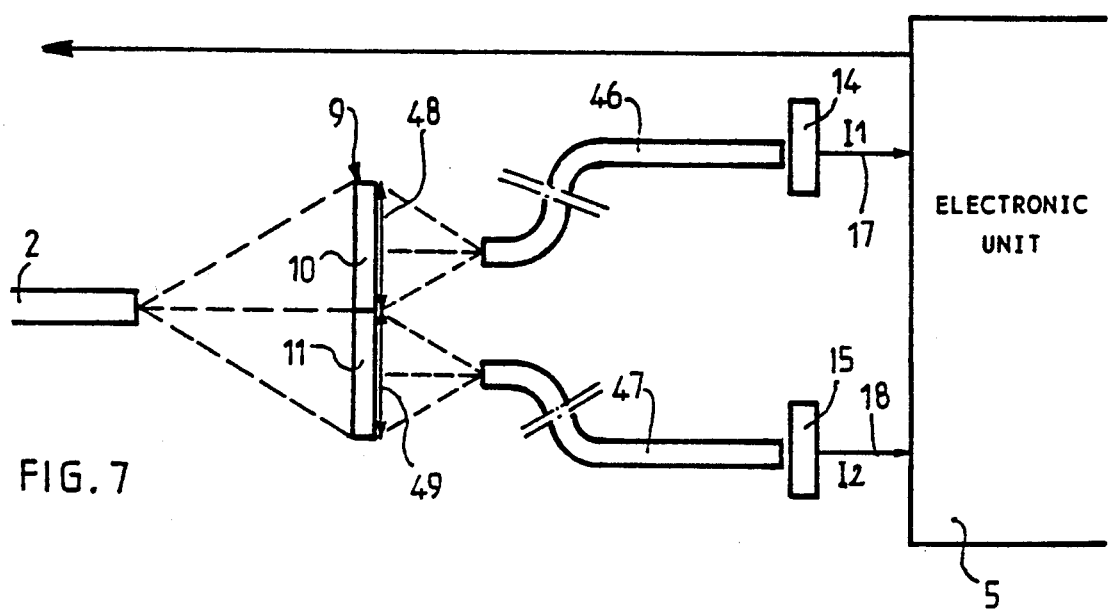
FIG. 7 shows an alternative embodiment of the detection part of the sensor according to FIG. 1.

FIG. 7, shows a "90°" detection module, which comprises the same separator-polarizer disk 9 as in FIG. 1, but wherein the standard photodetectors 14 and 15 are located at a distance by means of two additional optic fibers 46 and 47 associated with two focusing lenses 48 and 49. Naturally, a system of this kind is applicable to "45°" detection according to FIG. 5: an auxiliary fiber placed at the outlet of the center orifice 38 of the disk 9 would then have to be provided in addition.

Figure 8:
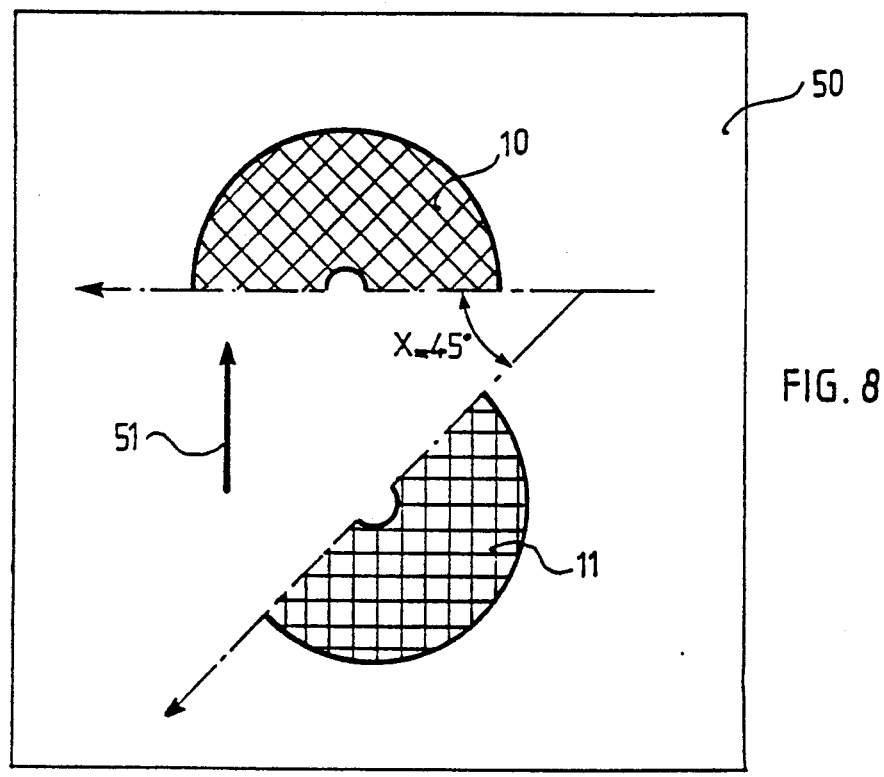
FIG. 8 shows how a separator-polarizer such as the one according to FIG. 6 can be easily achieved, advantageously by laser cutting.

A convenient means for achieving the separator-polarizer disk 9 in either of these cases is represented schematically in FIG. 8. It consists in procuring an off-the-shelf polarizing film 50, of favored polarization direction 51, and then cutting out of film 50, preferably with a laser beam, two half-disks 10 and 11 oriented on the film according to the required angle X, here equal to 45°.

These two half-disks, provided with a half-orifice which may be central or not depending on the case, are then simply assembled edge to edge to form a complete disk, according to FIG. 6 or FIG. 2, depending on the case. Easily programable cutting is thus obtained, and if laser cutting is involved is assured excellent quality. Accurate adjustment of the respective polarization axes 12 and 13 on the optic bench is moreover no longer really necessary.

The invention is not limited to a separator-polarizer 9 made up of two pieces. It likewise applies to a separator-polarizer in three or four pieces, as illustrated for example in FIGS. 9 and 10.

Figure 9:
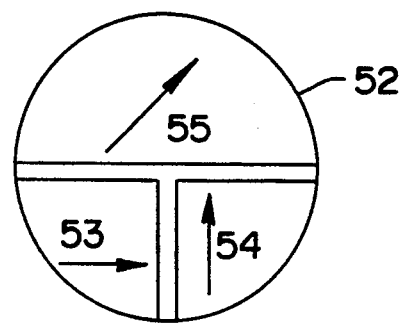
FIGS. 9 and 10 illustrate two alternative embodiments of the separator-polarizer of a device according to the invention.

In FIG. 9, the separator-polarizer is made up of three pieces. The polarization direction 53 of a first quarter disk makes an angle of 90° with the polarization direction 54 of a second quarter disk. Polarization direction 53 forms an angle of 45° with the polarization direction 55 of the third piece (half disk). The the three pieces are adjoined so as to form a disk. Three signals are thus obtained whose intensities I3, I4 and I5 correspond respectively to:

$$I3 = Io\,(1+\cos 2F)/8$$

$$I4 = Io\,(1-\cos 2F)/8$$

$$I5 = Io\,(1+\sin 2F)/4$$

Io can then be obtained by : Io=4 (I3+I4) and the angle F calculated from I5 and I3−I4.

Naturally a suitable photodetector is located downline from the separator-polarizer to collect the corresponding signals.

Figure 10:
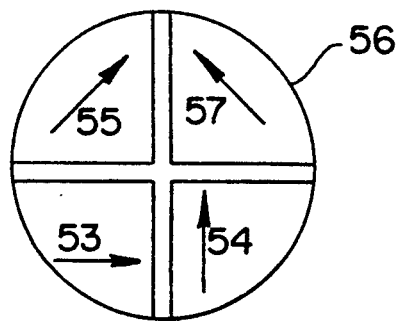

The separator-polarizer 56 according to FIG. 10 is made up of four pieces, each forming a quarter disk. The polarization directions of the pieces form either an angle of 90° or an angle of 45°. FIG. 10 shows the directions 53, 54 and 55 of FIG. 3, the fourth direction 57 forming an angle of 90° with the direction 55.

We obtain, for example by means of a four-quadrant photodetector, four signals I3, I4, I6 and I7, with:

$I6 = Io(1+\sin 2F)/8$ $I7 = Io(1-\sin 2F)/8$

We can then calculate:

$Is = I6 - I7 = (Io. \sin 2F)/4$ $Ic = I3 - I4 = (Io. \cos 2F)/4$ $Io = 2(I3+I4+I6+I7)$ and deduce therefrom the value of F.

We claim:

1. A device for measuring the current intensity of current flowing in a conductor, comprising:
   a monomode optic fiber making a predetermined number of turns around the conductor;
   an emitting laser diode for generating and flowing a linearly polarized light beam through the optic fiber; and
   a measuring device located at the output end of the optic fiber to measure the angle rotation of the linear polarization direction of the light beam due to the effect of the magnetic field created by the current, the angle rotation being representative of the current intensity to be measured, the measuring device comprising:
   a separator-polarizer formed by at least two pieces of polarizing film through which the light beam coming from the output end of the optic fiber passes, wherein the polarization directions of the pieces of film form predetermined angels between each other; and
   a respective photodiode associated with each of the pieces of film to emit a respective current corresponding to the intensity of the light received by each respective photodiode, each of the photodiodes being connected to an electronic unit capable of calculating the angle rotation and to deduce therefrom the value of the current intensity.

2. The device of claim 1, wherein the separator-polarizer comprises two pieces of film which are coplanar to each other and substantially orthogonal to the axis of the light beam, each piece of film forming a half-disk having the same diameter and being arranged to form a complete disk, the complete disk being coaxial to the light beam output from the fiber, the angle formed between the polarization directions of the two pieces being one of 90° and 45°.

3. The device of claim 1, wherein the separator-polarizer comprises two pieces of polarizing film and has an axial orifice, the angle formed between the polarization directions of the two pieces of polarizing film being 45°, the device further comprising an additional photodiode placed behind the axial orifice of the separator-polarizer for supplying to the electronic unit a signal representative of the intensity of the light beam emitted by said emitting laser diode.

4. The device of claim 3, wherein the photodiodes associated with the two half-disks are formed by a two-quadrant photodiode adjoined behind the separator-polarizer, the photodetector comprising an axial orifice contiguous to the axial orifice of the separator-polarizer to allow a portion of the light beam coming from the fiber to be incident on the additional photodiode.

5. The device of claim 1, wherein the separator polarizer comprises two pieces of polarizing film and the angle formed between the polarization directions of the two pieces of polarizing film is 45°, the device further comprising a mirror located between the output end of the optic fiber and the separator-polarizer for reflecting a portion of the light beam to an auxiliary photodiode which supplied a signal representative of the intensity of the light beam emitted by the emitting laser diode to the electronic unit.

6. The device of claim 1, wherein the separator-polarizer comprises two half-disks positioned to form a complete disk and the photodiodes associated with the two half-disks are formed by a two-quadrant photodiode in the shape of a disk of the same diameter as that of the separator-polarizer, wherein the two-quadrant is positioned behind the separator-polarizer.

7. The device of claim 1, further comprising auxiliary optic fibers to enable the photodiodes to be located a distance away from the separator-polarizer.

8. The device of claim 1, wherein a first piece of said at least two pieces of polarizing film is placed on a first support, and a second piece of said at least two pieces of polarizing film is placed on a second support, and the two supports are movable in rotation with respect to each other in order to adjust the respective polarization directions of the first and second pieces.

9. The device of claim 1, further comprising holding means for holding the output end of the optic fiber in a position, and support means for supporting at least the separator-polarizer thereby forming a rigid assembly movable in rotation to perform adjustment of the separator-polarizer when no current is flowing through the conductor, without touching the fiber.

* * * * *